United States Patent
Butterbaugh et al.

(10) Patent No.: US 9,591,784 B2
(45) Date of Patent: Mar. 7, 2017

(54) MULTIPLE-BACKPLANE IMPLEMENTATIONS FOR MODULAR PLATFORMS

(71) Applicant: International Business Machines Corporation, Armonk, NY (US)

(72) Inventors: Matthew A. Butterbaugh, Rochester, MN (US); Eric A. Eckberg, Rochester, MN (US); Camillo Sassano, Durham, NC (US); Kevin L. Schultz, Raleigh, NC (US); George W. Van Leeuwen, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 107 days.

(21) Appl. No.: 14/528,488

(22) Filed: Oct. 30, 2014

(65) Prior Publication Data

US 2016/0128221 A1 May 5, 2016

(51) Int. Cl.
H05K 7/14 (2006.01)

(52) U.S. Cl.
CPC ......... *H05K 7/1488* (2013.01); *H05K 7/1492* (2013.01)

(58) Field of Classification Search
CPC . H05K 7/1488; H05K 7/1492; A47B 47/0091
USPC .......................................................... 211/26
See application file for complete search history.

(56) References Cited

U.S. PATENT DOCUMENTS

| | | | | |
|---|---|---|---|---|
| 5,617,299 A | * | 4/1997 | Knoop | H05K 7/1457 361/788 |
| 6,154,373 A | * | 11/2000 | Durston | H05K 1/14 174/261 |
| 6,349,037 B1 | * | 2/2002 | Draughn | H05K 7/1459 361/785 |
| 6,483,709 B1 | * | 11/2002 | Layton | H05K 7/1454 361/679.4 |
| 6,757,177 B2 | * | 6/2004 | Harris | G02B 6/43 361/788 |
| 8,009,438 B2 | * | 8/2011 | Leigh | H05K 1/144 361/788 |
| 8,743,549 B2 | | 6/2014 | Frink et al. | |
| 2002/0090844 A1 | * | 7/2002 | Kocin | H05K 1/14 439/74 |
| 2005/0117309 A1 | * | 6/2005 | Rieken | H05K 7/1492 361/724 |

(Continued)

FOREIGN PATENT DOCUMENTS

WO 2014099881 A1 6/2014

*Primary Examiner* — Korie H Chan

(74) *Attorney, Agent, or Firm* — Patterson + Sheridan, LLP

(57) ABSTRACT

A chassis for mounting sub-rack modular units is disclosed that includes a frame defining a forward opening through which modular units are inserted to attach to the frame, a first backplane attached to the frame and that operates to provide a first functionality to one or more attached modular units that are coupled to connectors of the first backplane, and a second backplane attached to the frame and that operates to provide a second functionality to one or more attached modular units that are coupled to connectors of the second backplane, wherein the second functionality is different than the first functionality.

16 Claims, 6 Drawing Sheets

(56) References Cited

U.S. PATENT DOCUMENTS

| | | | |
|---|---|---|---|
| 2005/0207134 A1* | 9/2005 | Belady | H05K 1/14 361/796 |
| 2006/0274508 A1* | 12/2006 | LaRiviere | H05K 7/1488 361/727 |
| 2007/0238326 A1* | 10/2007 | Fallah-Adl | H05K 7/1451 439/67 |
| 2012/0019117 A1* | 1/2012 | Dunwoody | H05K 7/1491 312/330.1 |
| 2013/0308265 A1* | 11/2013 | Arnouse | H05K 7/1488 361/679.41 |
| 2014/0126170 A1 | 5/2014 | Bai et al. | |
| 2014/0170865 A1 | 6/2014 | Peterson et al. | |

* cited by examiner

MULTIPLE-BACKPLANE IMPLEMENTATIONS FOR MODULAR PLATFORMS

BACKGROUND

The present disclosure relates to sub-rack modular units, and more specifically, to backplane design for sub-rack modular units.

Modern server platforms and various other processing platforms (such as professional audio and/or video processing systems, telecommunications systems, control systems, etc.) are designed to support a plurality of modular nodes having standardized form factors. Each modular node provides particular function(s) to the greater system, and may connect to a common backplane. Conventionally, the common backplane must fully support the various interconnection requirements of each of the modular nodes, requiring complex and costly backplane design and preventing the ability to flexibly expand the system to incorporate modules having different functionality.

SUMMARY

Embodiments disclosed herein include a chassis for mounting sub-rack modular units. The chassis includes a frame defining a forward opening through which modular units are inserted to attach to the frame, a first backplane attached to the frame and that operates to provide a first functionality to one or more attached modular units that are coupled to connectors of the first backplane, and a second backplane attached to the frame and that operates to provide a second functionality to one or more attached modular units that are coupled to connectors of the second backplane, wherein the second functionality is different than the first functionality.

Embodiments also include a modular and scalable server platform that includes a plurality of sub-rack modular units, each providing a respective function, a frame defining a forward opening through which the plurality of modular units are inserted to attach to the frame. The server platform also includes a first backplane attached to the frame and that operates to provide a first functionality to one or more of the plurality of modular units that are coupled to connectors of the first backplane, and a second backplane attached to the frame and that operates to provide a second functionality to one or more of the plurality of modular units that are coupled to connectors of the second backplane, wherein the second functionality is different than the first functionality.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1A:
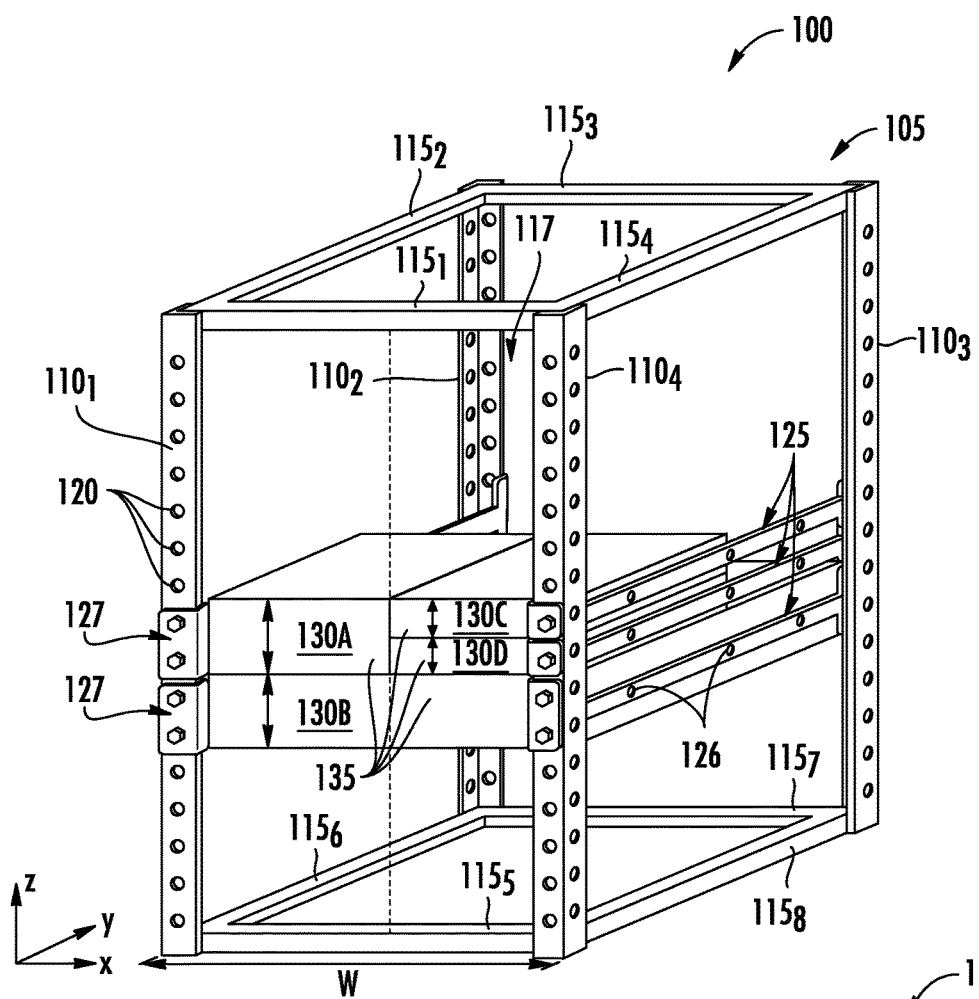
FIGS. 1A and 1B illustrate a chassis for mounting sub-rack modular units to one or more backplanes, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, brief summary, or the following detailed description.

Various embodiments of the present technology provide a scalable architecture for modular sub-rack units. In embodiments described herein, expanded functionalities for modular units may be supported by connecting modular units to a first backplane providing a first set of functionalities and to a second backplane providing a second set of functionalities (e.g., specialized functionalities). Embodiments may include two or more backplanes, and each modular unit may be configured to couple to various ones of the two or more backplanes depending on the functionality required by the modular unit. By providing configurations using separate backplanes, initial design and manufacturing costs may be reduced, and systems may be selectively adaptable to support emerging functionalities.

Figure 1B:
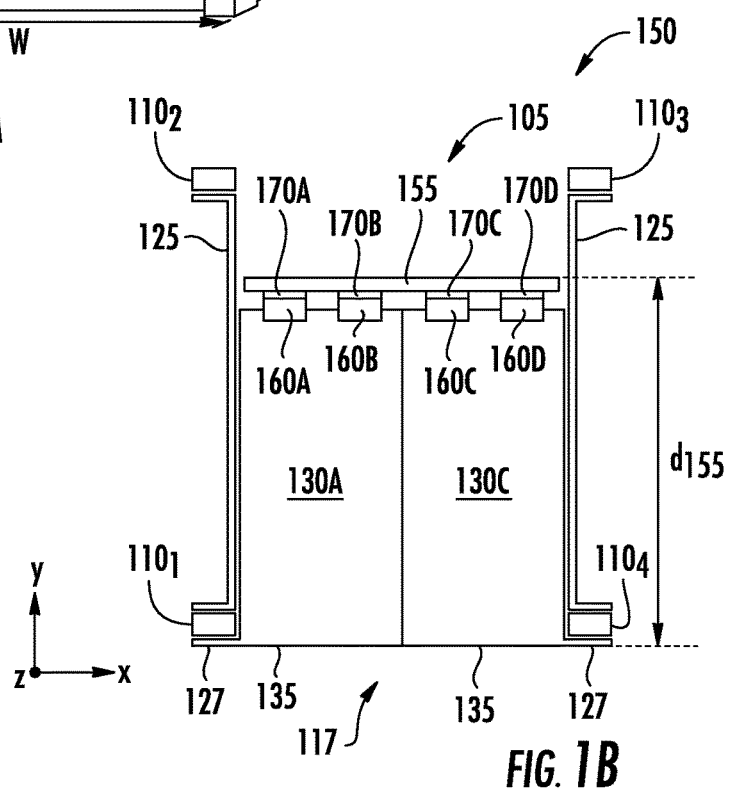

FIGS. 1A and 1B illustrate a chassis for mounting sub-rack modular units to one or more backplanes, according to embodiments described herein. As shown, chassis 100 includes a frame 105 that is coupled to a plurality of modular units 130. The frame 105 includes a plurality of structural rails 110, 115 that are physically attached to provide support and alignment for attached modular units 130 and/or other components. As shown, the structural rails may be grouped into vertical rails 110 and horizontal rails 115, but alternative orientations and configurations are possible. Vertical rails $110_1$, $110_4$ and horizontal rails $115_1$, $115_5$ define a forward opening 117 of the frame 105, through which modular units 130 may generally be inserted to attach to the frame 105. When a particular modular unit 130 is attached to the frame 105, a front panel 135 of the modular unit 130 is generally disposed proximate to (and oriented with) the forward opening 117. In this way, the front panels 135 of multiple modular units 130 may be accessed on a common side of the frame 105. The dimensions of the vertical rails 110 and horizontal rails 115 may be selected to conform to standardized sizes for the modular units 130. For example, some common widths (w) for modular units and frames include 19 inches and 23 inches. Of course, modular units and/or frames having non-standard sizes may also be compatible with standard-sized frames and/or modular units by using mounting brackets or other suitable hardware.

The vertical rails 110 each include a plurality of mounting holes 120 that are used for fastening the vertical rail to the front panels of modular units or to any associated mounting hardware. The mounting holes 120 may be disposed along the length of the vertical rail at a regular interval or in a standardized pattern. For example, the mounting holes 120 may be disposed in a pattern to support modular units that are dimensioned in multiples of standardized rack units (or "U"). The standard U corresponds to a height of 44.5 millimeters (or approximately 1.752 inches). Of course, other standardized systems are possible.

The mounting holes 120 may support bolted or boltless mounting of the modular units 130. Edge portions 127 of the front panels 135 of modular units 130 may be attached to the vertical rails 110 using one or more mounting holes 120. For bolted mounting, the mounting holes 120 may be tapped to receive a threaded bolt, or may include unthreaded holes through which a bolt is inserted and fastened using a corresponding nut. That is, a bolt may be inserted through a hole in an edge portion 127 and a corresponding hole 120, and fastened to attach the modular unit 130 to the vertical rail 110. For boltless mounting, the mounting holes 120 may include unthreaded holes that are shaped and dimensioned to interface with a corresponding part of a modular unit 130, such as by hooking or clipping the edge portions 127 into corresponding mounting holes 120.

The frame 105 may also include one or more side rails 125 that are attached to the vertical rails 110 and/or the modular units 130. Side rails 125 may provide additional rigidity to the frame 105, and may specifically provide structural support for the modular units 130 along the depth of the frame 105 (corresponding to the y-axis as shown). The side rails 125 may include one or more mounting holes 126, through which a bolt may be inserted to fasten to a corresponding (tapped) hole in the side of a modular unit 130.

The rail structure of the frame 105 may accommodate modular units 130 of various depths, and may accommodate other components that are provided to support the operation of modular units 130. For example, the frame 105 may accommodate power supplies providing electrical power to the modular units, and cooling systems for removing heat from the modular units 130. The frame 105 may also accommodate structures that provide interconnectivity between the various modular units 130, such as one or more backplanes that physically attach to connectors included in the modular units 130.

While shown for clarity as a skeletal frame having a substantially orthogonal rail structure, chassis 100 may include alternate configurations of frame 105. For example, the rail structure may include one or more substantially non-orthogonal portions, and/or the modular units 130 may be partially or entirely enclosed by one or more walls or other components. In some cases, an enclosed configuration may be desirable to isolate sensitive components from the conditions of an external environment (e.g., heat, humidity, dust, EMI, etc.), as well as to provide better-controlled cooling for the modular units 130. Additionally, the chassis 100 may be standalone or may be mounted in a larger rack.

The modular units 130 are generally included to provide functionality to a system, and may include fully enclosed units and/or units having exposed components. For example, modular units 130 may include blade servers having an exposed main board and/or attached components. In some embodiments, the modular units 130 may provide a modular, scalable computing platform, in which the modular units each provide distinct services for the computing platform (such as distinct computing modules, storage modules, acceleration modules, and so forth). In one embodiment, the computing platform may be used as a server or other networking platform. In other embodiments, the modular system may be used in alternative applications, such as professional audio and/or video processing systems, telecommunications systems, entertainment control systems, industrial control systems, military systems, and so forth.

The front panels 135 generally provide an interface to each modular unit 130 for a user and/or other modular units or devices. Front panels 135 may include interconnectivity (such as one or more ports for networking or input/output devices), a display including one or more indicators of operational status of the modular unit 130, input devices for receiving user inputs (such as buttons or a directional pad), as well as venting areas to permit airflow through the modular unit 130 for cooling components.

The modular units 130 may have varying dimensions. For example, the modular units may be full-width (such as modular unit 130B) or a fraction of the full width of the frame 105, such as half-width (130A, 130C, 130D) modules. The front panels 135 may have different standard or non-standard heights, e.g., 1U, 2U, 3U, 4U, and so forth. For example, modular unit 130A may correspond to a 2U height, while modular units 130C, 130D may correspond to a 1U height.

FIG. 1B illustrates a cross-sectional view 150 of the frame 105 described above. As shown, view 150 includes four vertical rails 110, two side rails 125 coupled to the vertical rails 110, and half-width modular units 130A and 130C. Modular units 130A, 130C include a plurality of connectors 160A-D that are used to couple to backplane connectors 170A-D of backplane 155. Backplane 155 generally includes circuitry used to provide a desired functionality to/for the modular units 130A, 130C. Backplane 155 may include a rigid or flexible circuit board (or cabling) that is also physically attached to the frame 105, for example, using a plurality of mounting brackets or other hardware (not shown). Likewise, connectors 160A-D, 170A-D may include rigid contacts, such as socket connectors, headers, plugs, jacks, etc. and may further include flexible cabling. In one embodiment, connectors 160A-D are complementary to connectors 170A-D, and the respective connectors seat fully when the modular unit 130A, 130C is inserted into the frame 105. Backplane 155 may be passive (e.g., including only passive electrical components and/or conductive traces) or may include active components (e.g., powered circuitry, which may include a controller or other processing element). Backplane 155 may provide communicative connections between modular units 130A and 130C, and may provide processing or other services for connected modular units. For example, the backplane connectors 170A, 170C may be coupled to circuitry allowing communications between modular units 130A, 130C, while connectors 170B, 170D may be coupled to circuitry providing electrical power to the modular units.

As shown, backplane 155 is disposed at a depth $d_{155}$ from the forward opening 117. The depth $d_{155}$ may be selected such that when modular units 130A, 130C are inserted into the forward opening 117, the edge portions 127 couple to vertical rails $110_1$, $110_4$ and the connectors 160A-D fully seat with the backplane connectors 170A-D.

Although not shown in this view, the backplane 155 may extend along the z-axis (i.e., into and out of the page as viewed), and may include additional connectors 170 at predetermined positions in the z-axis direction for coupling to different modular units 130. These configurations are discussed in additional detail below with respect to FIGS. 5A, 5B, and 6B.

Figure 2:
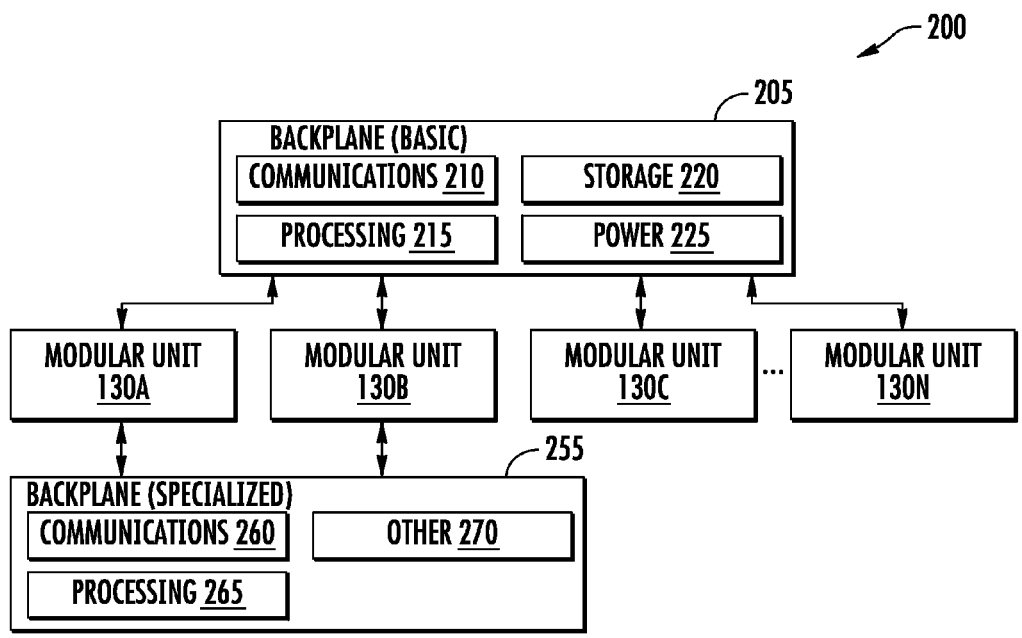
FIG. 2 illustrates a block diagram of mounted sub-rack modular units coupled to a single backplane, according to embodiments described herein.

FIG. 2 illustrates a block diagram of mounted sub-rack modular units coupled to a single backplane, according to embodiments described herein. System 200 includes a plurality of N modular units 130A-N coupled to a basic backplane 205. The basic backplane 205 may generally have similar functionality to backplane 155 described above, and may provide various services to each of the coupled modular units 130. For example, the basic backplane may provide communications services 210 between modular units 130 and to/from other networked devices, processing services 215, storage services 220, and power services 225.

While each of the plurality of modular units 130A-N may include various common functionalities that are supported by the basic backplane 205, a particular subset of the modular units 130A-N (as shown, modular units 130A, 130B) may also include different (or enhanced) functionalities that are not supported by the basic backplane 205. As shown, specialized backplane 255 includes communications services 260, processing services 265, and other services 270, some or all of which may be distinct from the functionalities provided by the basic backplane 205. For example, the basic backplane 205 may support a set of "general services," such as connectivity, power, etc. described above for the modular units 130A-N. However, the modular units 130A, 130B may be high-speed networking devices that require relatively complex circuitry to support their high-speed communications operation. Although modular units 130A, 130B may be connected to the basic backplane 205 and may use the "general services" provided thereby, the "specialized services" needed by modular units 130A, 130B (e.g., specialized circuitry to support high-speed operation) are not included in the basic backplane 205.

Conventionally, expanding the system 200 to support this additional specialized functionality would require a redesign of the backplane to incorporate this additional circuitry. Such a redesign, however, may not be feasible or economical. Given size constraints and restraints within the frame and relative to each of the modular units 130, in some cases a backplane design simply may not be able to support additional circuitry. The additional circuit complexity, and its spatial distribution on the backplane, will also require additional power and cooling considerations to operate stably. The additional circuitry components and altering the schematic layout of the backplane create additional costs for the manufacturing of the backplane. Moreover, when a different modular unit 130 is introduced requiring yet another new functionality, another backplane redesign will be required to accommodate the new functionality. Thus, the benefits gained by extending the functionalities of the backplane through redesign may be substantially outweighed by any of these various considerations.

In embodiments described herein, specialized functionalities for particular modular units may be supported by connecting these modular units to a first backplane providing a first set of functionalities and to a second backplane providing a second set of functionalities (e.g., specialized functionalities). Embodiments may include two or more backplanes, and modular units may be configured to couple to various ones of the two or more backplanes depending on the functionality required by the modular units. By providing configurations using separate backplanes, initial design and manufacturing costs may be reduced, and systems may be selectively adaptable to support emerging functionalities.

Figure 3:
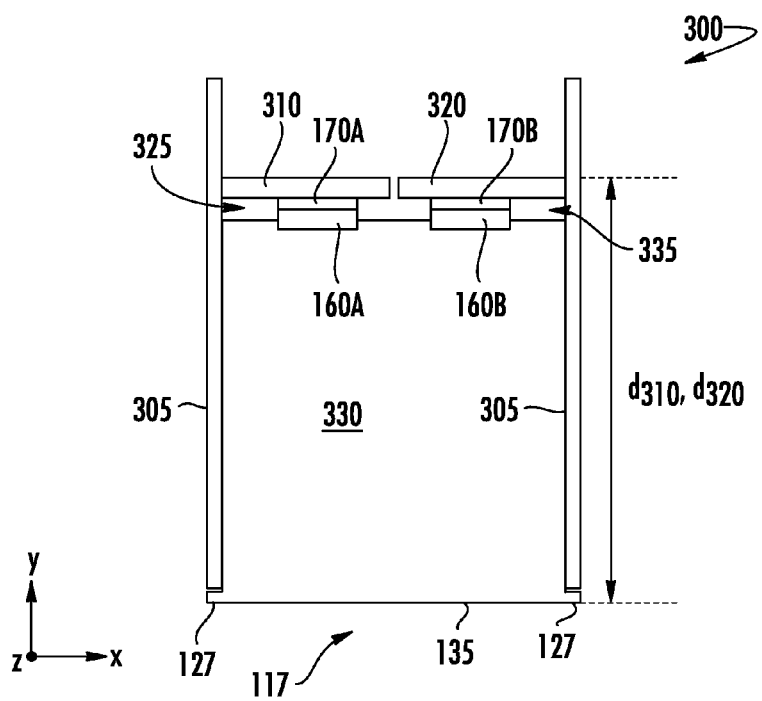
FIG. 3 illustrates a mounted full-width modular unit coupled to two backplanes, according to embodiments described herein.

FIG. 3 illustrates a mounted full-width modular unit coupled to two backplanes, according to embodiments described herein. Specifically, FIG. 3 discloses a cross-sectional view 300 that includes two sidewalls 305 and a full-width modular unit 330. The modular unit 330 includes a front panel 135 disposed near the forward opening 117 defined by the sidewalls 305 (and by upper and lower components such as rails or walls, which are not shown), and edge portions 127 for connecting to the sidewalls 305.

Modular unit 330 includes a plurality of connectors 160A, 160B that are used to couple to backplane connectors 170A, 170B of backplanes 310, 320 at connections 325, 335 respectively. Backplanes 310, 320 generally include circuitry used to provide desired functionalities to/for the modular unit 330, and each may generally operate similar to the backplane 155 described above. Backplanes 310, 320 may generally be separated from each other (for example, laterally separated along the x-axis), and in some cases may include one or more connections between the backplanes 310, 320. Each backplane 310, 320 may be attached to the frame (such as to sidewalls 305), and may be disposed at a common depth $d_{310}$, $d_{320}$ from the forward opening 117. The depth $d_{310, 320}$ may be selected such that when modular unit 330 is inserted into the forward opening 117, the edge portions 127 couple to sidewalls 305 and both connectors 160A, 160B fully seat with the backplane connectors 170A, 170B. In other embodiments, the depths $d_{310}$, $d_{320}$ are not the same, and the dimensions of the modular unit 330 and/or connectors 160, 170 may be selected to span this difference (e.g., along the y-axis) and allow both sets of connectors 160, 170 to be fully seated simultaneously.

In some embodiments, the backplane 310 provides a first set of functionalities, e.g., basic communications and power, and backplane 320 provides a second set of functionalities, e.g., specialized functionalities. In one example, backplane 320 may be powered through a connection with backplane 310. In one embodiment, the backplanes 310, 320 may provide some common functionalities for the modular unit 330, offering some degree of redundancy in case of a failure of one backplane, its power supply, etc.

In the case of full-width modular units that are arranged in the "vertical" direction (e.g., "stacked" along the z-axis) within a chassis, a spatial separation between the backplanes 310, 320 (such as to discrete left and right "sides" along the x-axis, or forward or backward in the chassis along the y-axis) may be adequate to provide electrical isolation between the backplanes while allowing each of the modular units to connect to both backplanes. However, more complex configurations may generally be required to support multiple backplanes for embodiments that support half-width (or other partial-width) modular units. More complex configurations may also be desirable to accommodate the many design considerations for backplane circuitry (component area requirements, heat distribution, EMI, etc.). Generally, configurations that allow for larger backplanes may be preferable to allow for additional circuitry components, as well as a preferred disposition and distribution of circuitry components to meet design considerations.

Figure 4:
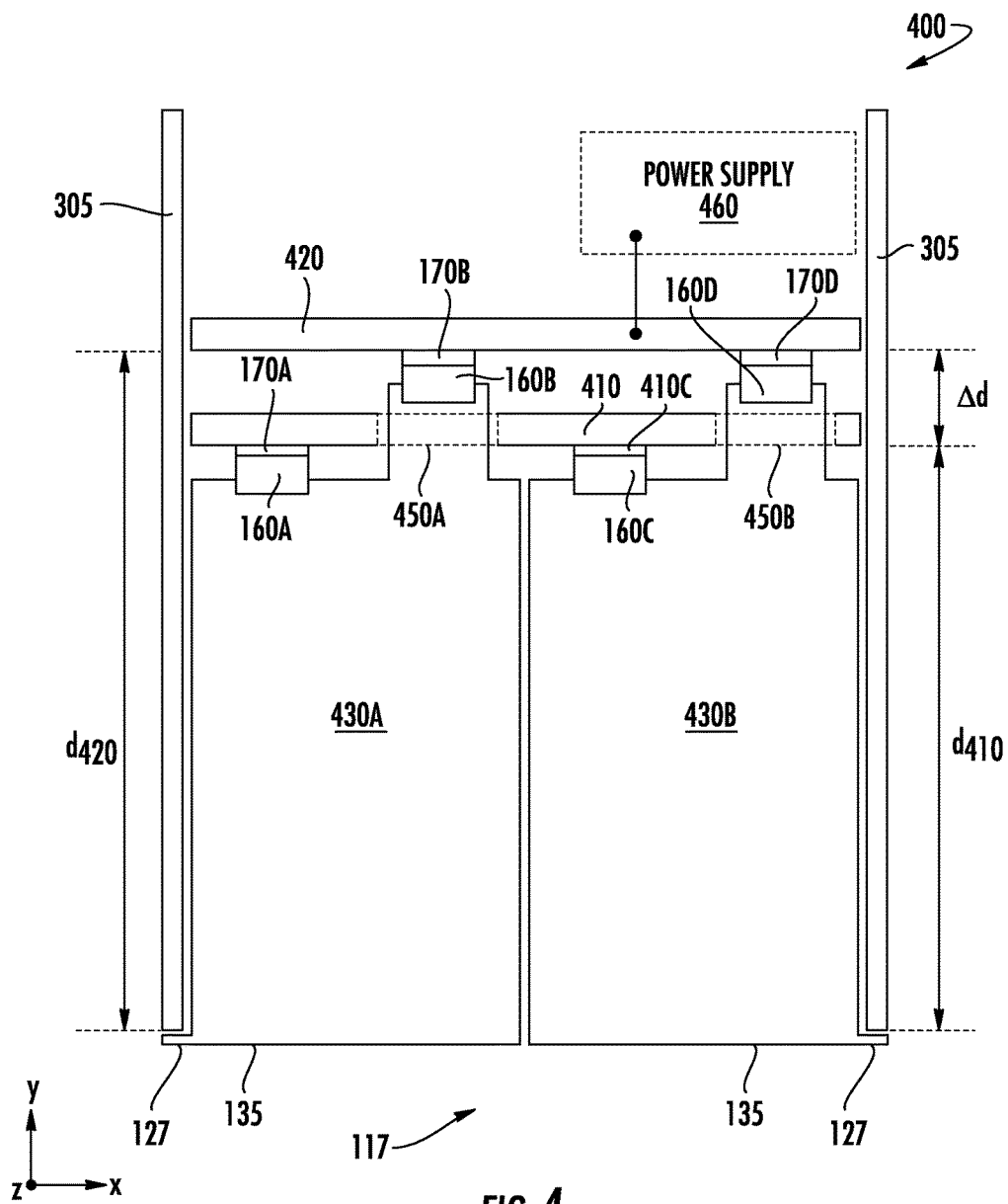
FIG. 4 illustrates two half-width modular units coupled to two backplanes at different depths, according to embodiments described herein.

FIG. 4 illustrates two half-width modular units coupled to two backplanes at different depths, according to embodiments described herein. Specifically, FIG. 4 discloses a cross-sectional view 400 that includes two sidewalls 305 and two half-width modular units 430A, 430B. The modular units 430A, 430B include respective front panels 135 disposed near the forward opening 117 defined by the sidewalls 305 (and by upper and lower components such as rails or walls, which are not shown), and edge portions 127 provided for connecting to the sidewalls 305.

Modular unit 430A includes connectors 160A, 160B, and modular unit 430B includes connectors 160C, 160D. Connectors 160A, 160C are configured to couple to a first backplane 410 at backplane connectors 170A, 170C Likewise, connectors 160B, 160D are configured to couple to a second backplane 420 at backplane connectors 170B, 170D. Each of the backplanes 410, 420 may extend in the direction of the z-axis and may include additional connectors 170 that support additional modular units 130. To accommodate the additional modular units, the first backplane 410 may define one or more openings 450A, 450B through which the modular units 430A, 430B may connect to the second backplane 420. The openings may be of any suitable shape and size, and may have relatively the same disposition relative to each half-width unit, so that the half-width units may be interchangeable. In one embodiment, each opening 450A, 450B includes a predetermined number of backplane connectors 170 (e.g., in a 1:1 ratio, 2:1, 3:1, etc.). In one embodiment, each opening 450A, 450B includes all of the backplane connectors 170 corresponding to a respective side of the frame (e.g., opening 450A includes all left-side module bays, and opening 450B includes all right-side module bays).

In one embodiment, modular units 430A, 430B may be shaped such that a portion of the modular unit (e.g., comprising a circuit board) extends through the openings 450A, 450B. In another embodiment, connectors 160B, 160D are elongated and extend from the modular units 430A, 430B through the openings 450A, 450B. In yet another embodiment, the backplane connectors 170B, 170D are elongated and extend through the openings 450A, 450B. In another embodiment, extension adapters (not shown) may be provided to couple connectors 160B, 160D to the backplane connectors 170B, 170D by extending through the openings 450A, 450B. In some cases, using elongated backplane connectors 170B, 170D may be preferable so that modular units 430A, 430B may have connectors 160A-160D disposed at a common depth. Having a common connector depth may permit the modular units 430A, 430B to also be physically compatible with other types of backplane configurations that do not support different backplane depths (such as conventional single backplanes).

The backplanes 410, 420 are disposed at respective depths $d_{410}$, $d_{420}$ from the forward opening 117. This spatial separation generally allows for electrical isolation between the backplanes, as well as a volume through which air may flow to remove heat from components of the backplanes 410, 420. Some properties of a suitable air flow may include establishing and maintaining desired pressure differentials between different regions for desired flow rates to adequately cool components of backplanes 410, 420, components of modular units 430A, 430B, other components disposed behind the backplanes, etc. Other properties may include controlling the air flow direction to cool certain components, and so forth. To establish a suitable air flow, several configuration parameters may be adjusted, such as the amount of separation $\Delta d$ between the backplanes 410, 420, and the shapes, sizes, and positions of the backplanes 410, 420, openings 450A, 450B, and the connectors 170A, 170B. Additionally, backplanes 410, 420 may include other openings (not shown) of predetermined shapes and sizes for improving air flow.

Each of backplanes 410, 420 may provide certain functionalities to the attached modular units 430A, 430B. Generally, any functionalities may be provided from any backplane position—that is, any particular functionality could be implemented using either backplane 410 or 420. However, certain configurations of the backplanes may be more advantageous. Using, for example, the classes of services for different backplanes described above (i.e., "general services" and "specialized services"), backplane 420 may be configured to provide general services to the attached modular units 430A, 430B, while backplane 410 is configured to provide specialized services. Of course, this is only one example, and other configurations are possible. Backplane 420 may connect to a number of different hardware modules disposed behind (i.e., at a greater depth in the +y-direction) the backplanes, such as a power supply 460 for powering the modular units 430A, 430B. Other types of hardware modules may include a system management module or other functional module that connects to one or more of the backplanes 410, 420. Generally, these hardware modules may operate without requiring a user interface, and so may be disposed behind the backplanes. The power supply 460 may generally be disposed away from the forward opening 117 such as at a depth beyond the modular units 430A, 430B and backplanes 410, 420. Connecting backplane 420 to the power supply 460 or to other hardware modules reduces the length of cabling (or electrical routing) required, and avoids having to route the connections through the openings 450A, 450B of the backplane 410, which may impede air flow and/or electrically interfere with other circuitry on backplanes 410, 420. Additionally, backplane 420 may generally have a greater area for placing and arranging circuitry than backplane 410, which includes several openings 450A, 450B to accommodate connections to backplane 420. The greater area of backplane 420 may thus be more suitable than backplane 410 for including a plurality of different functionalities for the modular units 430A, 430B.

For similar reasons, using backplane 410 to provide specialized functionality to the modular units 430A, 430B may be more beneficial than using backplane 420. In one embodiment, backplane 410 may be used to provide high-speed connectivity between different modular units 430A, 430B, and may also connect these modular units to a larger network. For example, the modular units 430A, 430B may be high-speed network switches. This type of connectivity is typically more sensitive to noise than other functions (power, lower-speed communications, etc.), and so providing the corresponding circuitry on the nearest backplane (i.e., backplane 410) may reduce the length of electrical routing, in turn reducing electrical impedance of the traces and lessening potential interference from other circuitry.

Consistent with the principles described above, in some embodiments, more than two different backplanes may be provided within the frame, and modular units 430A, 430B may be configured to connect to some or all of the backplanes. Further, while the preceding discussion has focused primarily on half-width modular units 430A, 430B having connectors for connecting to two different backplanes, the multiple backplane configuration of view 400 also supports "conventional" modular units that connect only to one of the backplanes 410, 420. Depending on the particular connector configuration, such a conventional modular unit may require elongated backplane connectors 170 or an extension adapter to couple to backplane 420. Additionally, the multiple backplane configuration also supports full-width (or other sized) modular units. For example, a full-width modular unit may include one or more connectors corresponding to any of connectors 160A-160D for coupling to backplanes 410 and/or 420. In one embodiment, a full-width modular unit may include one pair of connectors 160 for connecting to backplane 410 and backplane 420. In another embodiment, the full-width modular unit may include multiple connectors 160 for connecting to a backplane, providing parallel or redundant connections to the selected backplane.

Figure 5A:
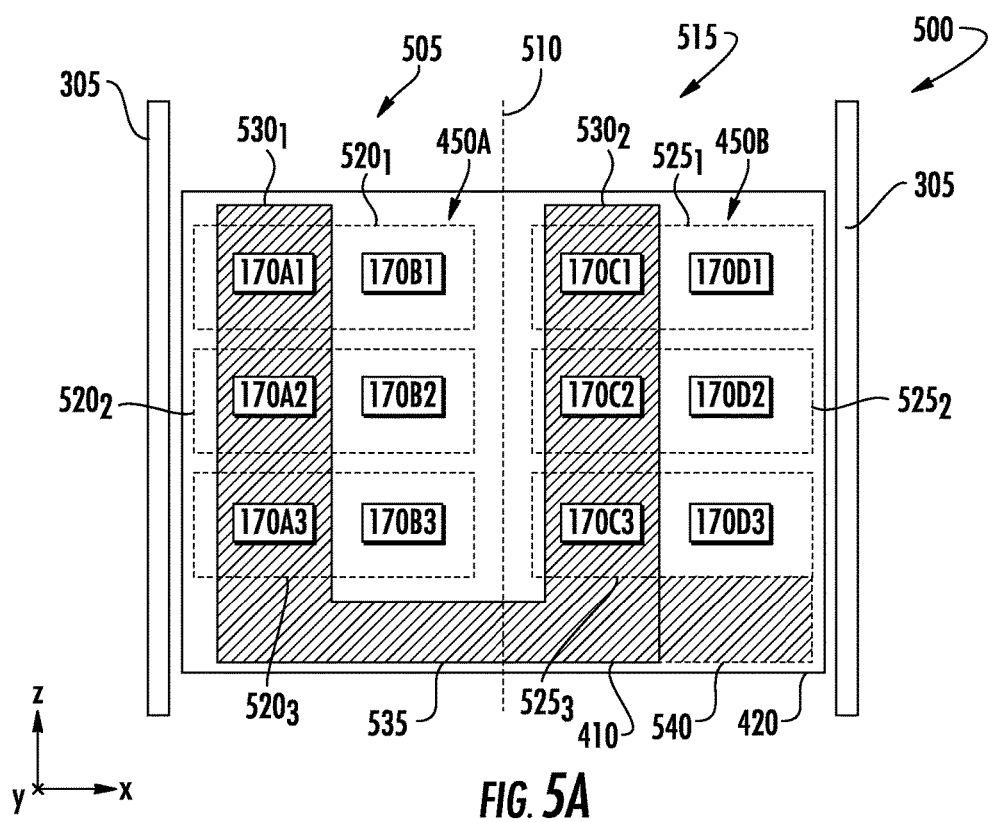
FIGS. 5A-5C illustrate various configurations of backplanes at different depths to couple to a plurality of modular units, according to embodiments described herein.
Figure 5B:
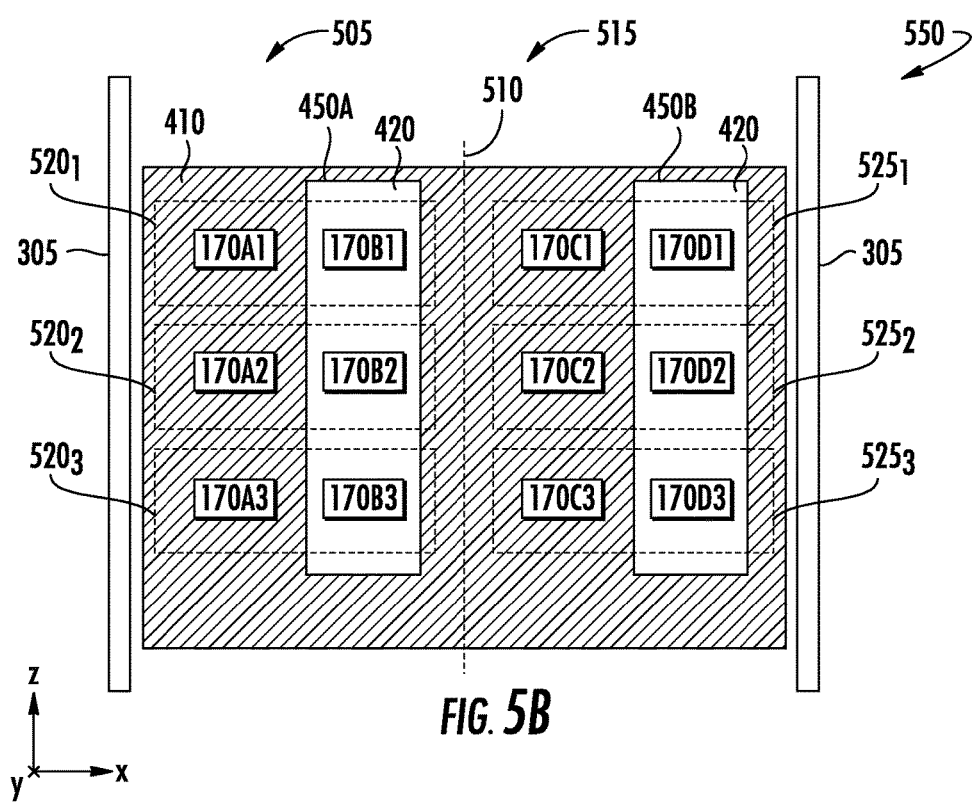
Figure 5C:
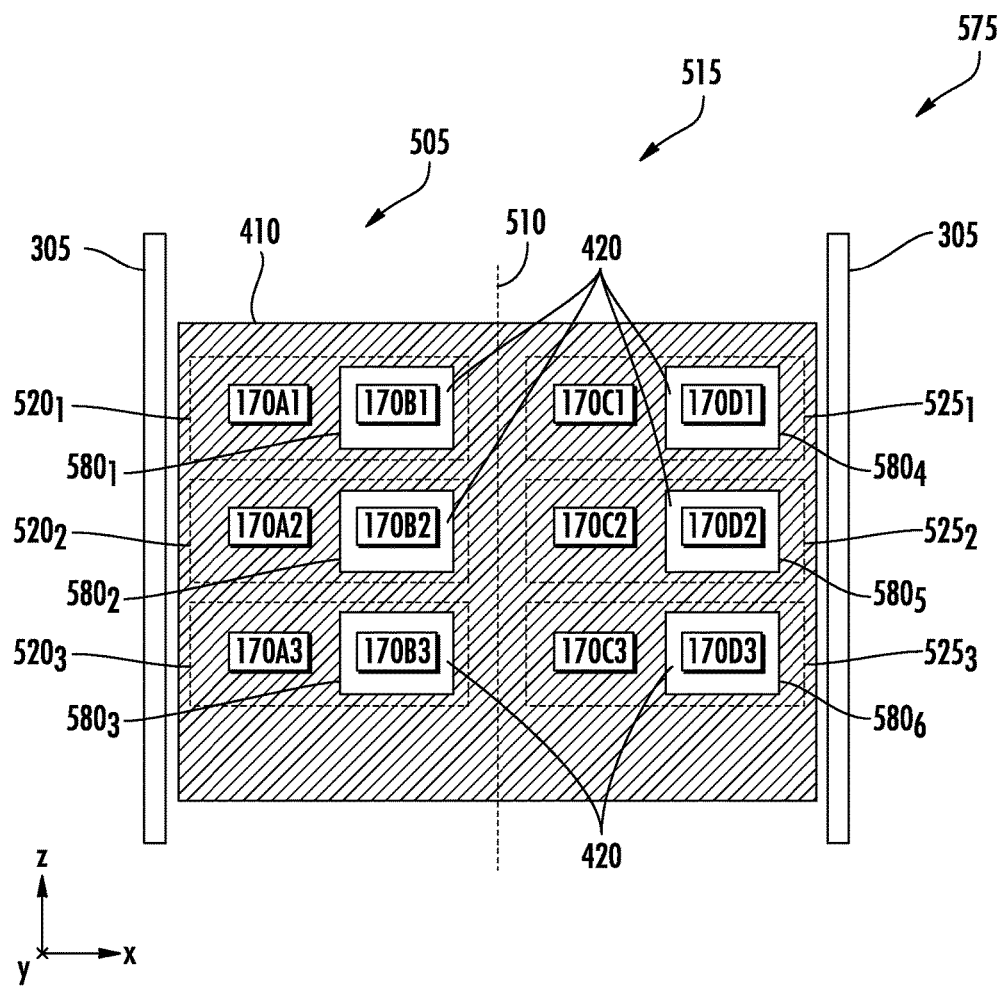

FIGS. 5A-5C illustrate various configurations of backplanes at different depths to couple to a plurality of modular units, according to embodiments described herein. The configurations 500, 550, 575 may generally be used consistent with the description of various elements in FIG. 4, such as modular units 430A, 430B. In configuration 500, backplanes 410 and 420 are disposed between sidewalls 305 and are connected to the sidewalls and/or upper or lower elements such as rails or walls (not shown). A center line 510 divides the configuration 500 into left side 505 and right side 515; generally, each of the sides is similarly configured to receive modular units. Each side may include a number of bays $520_1$-$520_3$, $525_1$-$525_3$ that are each configured to receive a half-width modular unit and include connections to both backplanes 410, 420. Pairings of left-side and right-side bays may be used to receive full-width modular units, such as $520_1$, $525_1$, and so forth. While three bays are depicted on each side, alternative embodiments may include more bays, fewer bays, unequal numbers of bays, etc. while remaining consistent with the description provided herein.

Backplane 420 may have any suitable size and shape, and is shown generally as planar to illustrate its relatively larger area for placing and arranging circuitry than backplane 410. On the other hand, backplane 410 includes one or more openings 450A, 450B through which a portion of a modular unit 430, connectors 160 or 170, and/or an extension adapter may extend to couple to backplane 420 at backplane connectors 170B1-3, 170D1-3. As shown, backplane 410 generally has a U-shape, comprising two legs $530_1$, $530_2$ and a connecting portion 535. Backplane 410 may include a plurality of backplane connectors 170A1-3, 170C1-3 on each of the legs $530_1$, $530_2$. These and backplane connectors 170B1-3, 170D1-3 may be disposed at predetermined positions within the configuration 500 such that a particular modular unit 430 may be inserted into any left-side or right side bay, and will couple to the corresponding connector(s) 170 in substantially the same way. Of course, other configurations of the backplane 410 are possible, such as an H-shaped backplane (where the connecting portion is disposed between two bays such as $520_2$, $520_3$), a backplane with multiple connecting portions 535, or including extended portions such as extension 540. These configurations may be more or less desirable based on the electrical characteristics and requirements of the circuitry on the backplane 410, as well as cooling requirements.

FIG. 5B illustrates a configuration 550 in which backplane 410 has a generally planar shape and a larger surface area than in configuration 500. The larger surface area may be desirable for placing and arranging circuitry on backplane 410. As shown, each opening 450A, 450B is generally rectangular and includes a predetermined number of backplane connectors 170B1-3, 170D1-3. Of course, the shapes and sizes of openings 450A, 450B may be selected to accommodate the connection to modular units, as well as reducing electrical interference and supporting desired air flow across the backplanes 410, 420.

Next, FIG. 5C illustrates a configuration 575 in which backplane 410 has a generally planar shape and a larger surface area than in configurations 500, 550. As shown, each opening $580_{1-6}$ is generally rectangular and corresponds to backplane connectors 170B1-3, 170D1-3 in a 1:1 ratio. Of course, other shapes and sizes are possible, as well as other ratios. Providing openings in a 1:1 ratio generally increases the surface area of backplane 410 through the additional area disposed between consecutive backplane connectors in the z-direction. Generally, the size and location of openings $580_{1-6}$ may be selected to achieve a desired pressure differential across and/or flow rate through backplanes 410, 420, as well as steering air flow across the backplanes 410, 420.

Figure 6A:
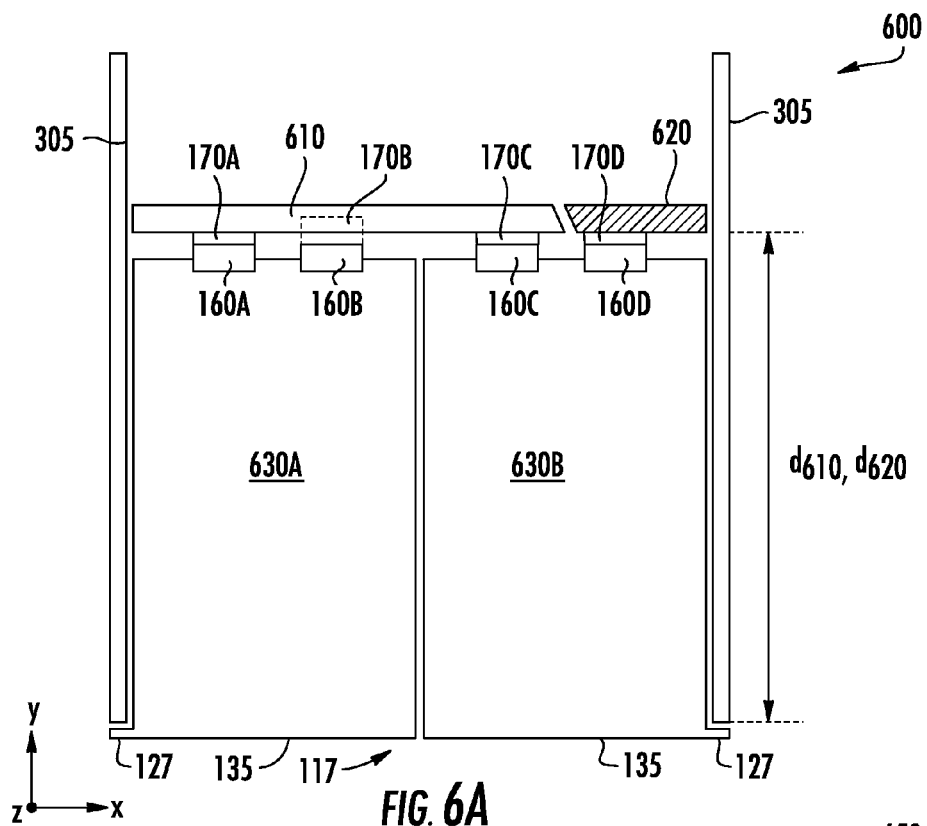
FIG. 6A illustrates two half-width modular units coupled to two backplanes at substantially a same depth, according to embodiments described herein.

FIG. 6A illustrates two half-width modular units coupled to two backplanes at substantially a same depth, according to embodiments described herein. Specifically, FIG. 6A discloses a cross-sectional view 600 that includes two sidewalls 305 and two half-width modular units 630A, 630B. The modular units 630A, 630B include respective front panels 135 disposed near the forward opening 117 defined by the sidewalls 305 (and by upper and lower components such as rails or walls, which are not shown), and edge portions 127 provided for connecting to the sidewalls 305.

Modular unit 630A includes connectors 160A, 160B, and modular unit 630B includes connectors 160C, 160D. Connectors 160A, 160C are configured to couple to a first backplane 610 at backplane connectors 170A, 170C Likewise, connectors 160B, 160D are configured to couple to a second backplane 620 at backplane connectors 170B, 170D. The view of backplane connector 170B is partly obscured by the first backplane 610 as backplanes 610, 620 are disposed at a common depth $d_{610}$, $d_{620}$. The backplanes 610, 620 may provide various functionalities for the coupled modular units 630A, 630B, consistent with the descriptions of modular units provided above.

Figure 6B:
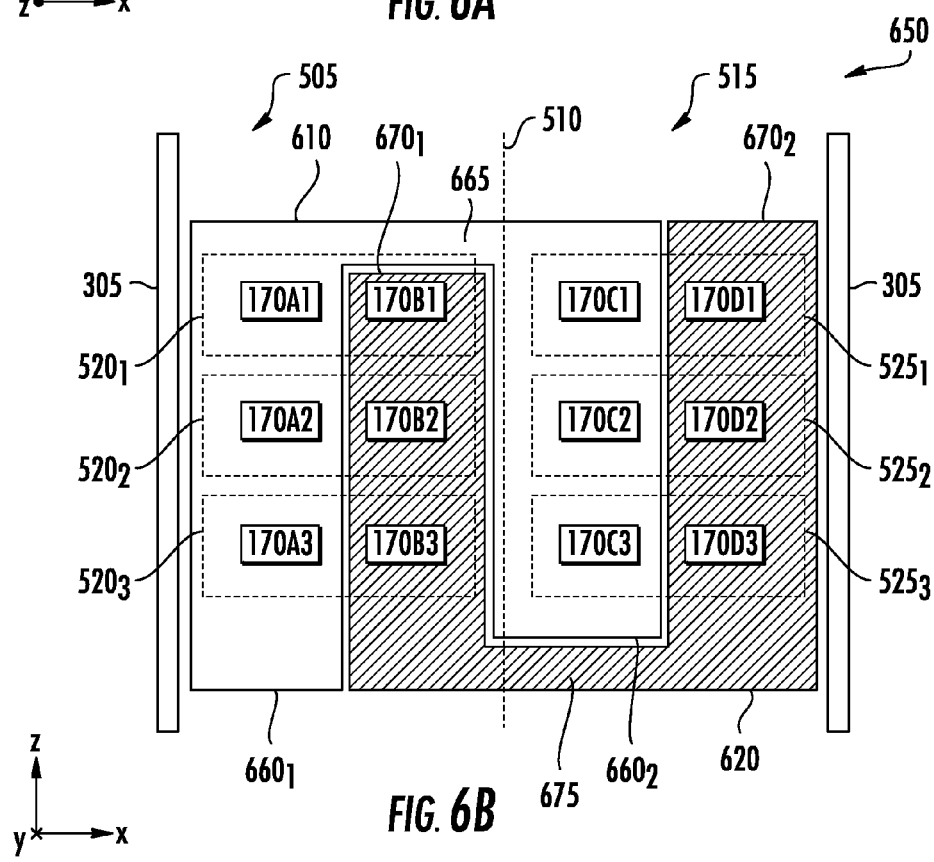
FIG. 6B illustrates a configuration of backplanes at substantially a same depth to couple to a plurality of modular units, according to embodiments described herein.

FIG. 6B illustrates a configuration of backplanes at substantially a same depth to couple to a plurality of modular units, according to embodiments described herein. Similar to FIGS. 5A-5C, FIG. 6B depicts a configuration 650 in which center line 510 divides the configuration 650 into left side 505 and right side 515 that are similarly configured to receive modular units. Each side includes a number of bays $520_1$-$520_3$, $525_1$-$525_3$ that are each configured to receive a half-width modular unit and include connections to both backplanes 610, 620. Pairings of left-side and right-side bays may be used to receive full-width modular units, such as $520_1$, $525_1$, and so forth.

The backplanes 610, 620 may have any suitable shape and size for disposing backplane connectors 170A-D in a desired arrangement. In one embodiment, the backplane connectors 170A-D are disposed at predetermined positions such that a particular modular unit 630 may be inserted into any left-side or right side bay, and will couple to the corresponding connector(s) 170 in substantially the same way. The backplanes 610, 620 are each generally U-shaped. Backplane 610 includes legs $660_1$, $660_2$ and connecting portion 665, while backplane 620 includes legs $670_1$, $670_2$ and connecting portion 675. The legs 660, 670 each include a number of backplane connectors 170 for connecting to modular units 630, and may be dimensioned to provide sufficient surface area for placing and arranging circuitry, and based on other electrical and thermal considerations. Of course, other suitable arrangements for the backplanes 610, 620 consistent with the descriptions provided herein will be apparent to the person of ordinary skill in the art.

Conclusion

Various embodiments disclosed herein provide a scalable architecture for modular sub-rack units. Embodiments may include two or more backplanes, with each modular unit configured to couple to various ones of the two or more backplanes, depending on the functionality required by the modular unit. By providing various configurations using separate backplanes, initial design and manufacturing costs may be reduced, and systems may be selectively adaptable to support emerging functionalities.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The block diagrams included in the Figures illustrate the architecture, functionality, and operation of possible implementations of systems according to various embodiments of the present disclosure.

In the preceding, reference is made to embodiments presented in this disclosure. However, the scope of the present disclosure is not limited to specific described embodiments. Instead, any combination of the preceding features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present disclosure, other and further embodiments may be devised without departing from the basic scope thereof, and the scope thereof is determined by the claims that follow.

What is claimed is:

1. A chassis for mounting sub-rack modular units, the chassis comprising:
a frame defining a forward opening sized and shaped to receive a plurality of modular units therethrough, wherein the plurality of modular units are attached to the frame;
a first backplane attached to the frame and that operates to provide a first functionality to a first one or more of the attached modular units that are coupled to connectors of the first backplane; and
a second backplane attached to the frame and that operates to provide a second functionality to a second one or more of the attached modular units that are coupled to connectors of the second backplane, wherein the second functionality is different than the first functionality; wherein the first and second backplanes are oriented substantially parallel to the forward opening, and wherein the first backplane is disposed at a first depth from the forward opening and the second backplane is disposed at a second depth greater than the first depth, and wherein the first backplane defines one or more openings through which an attached modular unit couples to the second backplane.

2. The chassis of claim 1, wherein at least one of the attached modular units is coupled to connectors of both the first and second backplanes.

3. The chassis of claim 1, wherein a difference between the first and second depths is selected based on cooling requirements for the backplanes.

4. The chassis of claim 1, wherein connectors of the second backplane extend through the one or more openings through the first backplane.

5. The chassis of claim 1, wherein portions of one or more attached modular units extend through the one or more openings to couple to the second backplane.

6. The chassis of claim 1, wherein the forward opening corresponds to a plurality of left-side bays and right-side bays defined within the frame that are each configured to receive a half-width modular unit, and wherein the first and second backplanes each include a left-side connector for coupling to a half-width modular unit inserted into a left-side bay, and a right-side connector for coupling to a half-width modulator unit inserted into a right-side bay.

7. The chassis of claim 6, wherein each of the first and second backplanes are substantially U-shaped, wherein one leg of the U includes one or more left-side connectors, and the other leg of the U includes one or more right-side connectors.

8. The chassis of claim 1, wherein the first functionality includes a first interconnection of a first complexity for the one or more attached modular units coupled to connectors of the first backplane, and the second functionality includes a second interconnection of a second complexity for the one or more attached modular units coupled to connectors of the first backplane, and wherein the first complexity is higher than the second complexity.

9. The chassis of claim 8, wherein the first interconnection has a higher speed than the second interconnection.

10. A modular and scalable server platform, comprising:
a plurality of sub-rack modular units, each providing a respective function;
a frame defining a forward opening sized and shaped to receive the plurality of modular units therethrough, wherein the plurality of modular units are attached to the frame;
a first backplane attached to the frame and that operates to provide a first functionality to a first one or more of the attached modular units that are coupled to connectors of the first backplane; and
a second backplane attached to the frame and that operates to provide a second functionality to a second one or more of the attached modular units that are coupled to connectors of the second backplane, wherein the second functionality is different than the first functionality; wherein the first and second backplanes are oriented substantially parallel to the forward opening, and wherein the first backplane is disposed at a first depth from the forward opening and the second backplane is disposed at a second depth greater than the first depth, and wherein the first backplane defines one or more openings through which an attached modular unit couples to the second backplane.

11. The server platform of claim 10, wherein at least one of the attached modular units is coupled to connectors of both the first and second backplanes.

12. The server platform of claim 10, wherein the plurality of modular units include one or more computing modules, storage modules, or acceleration modules.

13. The server platform of claim 10, wherein the forward opening corresponds to a plurality of left-side bays and right-side bays defined within the frame that are each configured to receive a half-width modular unit, and wherein the first and second backplanes each include at least one left-side connector for coupling to a half-width modular unit inserted into a left-side bay, and at least one right-side connector for coupling to a half-width modulator unit inserted into a right-side bay.

14. The server platform of claim 13, wherein each of the first and second backplanes are substantially U-shaped, wherein one leg of the U includes the at least one left-side connector, and the other leg of the U includes the at least one right-side connector.

15. The server platform of claim 10, wherein the first functionality includes a first interconnection of a first complexity for the one or more attached modular units coupled to connectors of the first backplane, and the second functionality includes a second interconnection of a second complexity for the one or more attached modular units coupled to connectors of the first backplane, and wherein the first complexity is higher than the second complexity.

16. A chassis for mounting sub-rack modular units, the chassis comprising:
- a frame defining a forward opening sized and shaped to receive a plurality of modular units therethrough, wherein the plurality of modular units are attached to the frame;
- a first backplane attached to the frame and that operates to provide a first functionality to a first one or more of the attached modular units that are coupled to connectors of the first backplane; and
- a second backplane attached to the frame and that operates to provide a second functionality to a second one or more of the attached modular units that are coupled to connectors of the second backplane, wherein the second functionality is different than the first functionality;
- wherein the forward opening corresponds to a plurality of left-side bays and right-side bays defined within the frame that are each configured to receive a half-width modular unit, and wherein the first and second backplanes each include a left-side connector for coupling to a half-width modular unit inserted into a left-side bay, and a right-side connector for coupling to a half-width modulator unit inserted into a right-side bay; and
- wherein each of the first and second backplanes are substantially U-shaped, wherein one leg of the U includes one or more left-side connectors, and the other leg of the U includes one or more right-side connectors.

* * * * *